United States Patent [19]

Koenig et al.

[11] Patent Number: 4,661,568

[45] Date of Patent: Apr. 28, 1987

[54] EPOXY RESIN COMPOSITION AND PROCESS FOR PREPARING LAMINATES THEREFROM

[75] Inventors: Raymond Koenig, Vendenheim, France; Robert Urscheler, Bühl/Baden; Dieter H. Klein, Rheinmünster, both of Fed. Rep. of Germany

[73] Assignee: The Dow Chemical Company, Midland, Mich.

[21] Appl. No.: 776,558

[22] PCT Filed: Jan. 30, 1985

[86] PCT No.: PCT/EP85/00026

§ 371 Date: Sep. 9, 1985

§ 102(e) Date: Sep. 9, 1985

[87] PCT Pub. No.: WO85/03515

PCT Pub. Date: Aug. 15, 1985

[51] Int. Cl.$^4$ .................. C08G 8/28; C08G 59/40; C08G 65/00

[52] U.S. Cl. .................................. 525/510; 528/118

[58] Field of Search ................. 525/510; 528/118

[56] References Cited

U.S. PATENT DOCUMENTS

| | | | |
|---|---|---|---|
| 4,393,181 | 7/1983 | Allen | 528/118 X |
| 4,467,070 | 8/1984 | Kordomenos et al. | 525/510 X |
| 4,537,946 | 8/1985 | Lohse et al. | 528/118 |

*Primary Examiner*—Lucille M. Phynes
*Attorney, Agent, or Firm*—Dragan J. Karadzic

[57] ABSTRACT

The epoxy resin composition is comprised of an epoxy resin, a solvent and a hardener which is the reaction product of a hexa-alkyl ether of a methylol melamine having the general formula (I), wherein each R, independently, is an alkyl radical having from 1 to 4 carbon atoms with a polyhydric phenol and, optionally, a monohydric phenol, with the phenol compound(s) having been employed in an amount to provide a ratio of at least one reactive phenolic hydroxy group for each alkoxy group.

14 Claims, No Drawings

EPOXY RESIN COMPOSITION AND PROCESS FOR PREPARING LAMINATES THEREFROM

The present invention is concerned with an epoxy resin composition and a process for preparing electrical laminates using said composition. Heretofore, laminates used in the preparation of electrical circuit boards, have been conventionally produced by impregnating a supporting or reinforcing web with a resin composition, by passing the impregnated mat through a heated chamber where the resin composition is partially cured, and laminating one or more layers of the resin mat with a layer such as copper foil under the application of heat and pressure. The resin as employed for impregnating, in general, is referred to as "varnish", and the impregnated resin mat, conventionally, is referred to as "prepreg". The electrical laminate, in known manner, is processed into circuit boards.

In general, epoxy resins are employed for impregnating the reinforcing web. A typical epoxy resin composition for the application as presently described, comprises a brominated epoxy resin prepared from a diglycidyl ether of bisphenol A and a tetrabromobisphenol A, dicyandiamide as a hardener, an organic solvent such as acetone, and an accelerator or catalyst. Unfortunately, the glass transistion temperature of a cured epoxy resin prepared from this varnish composition is undesirably low, e.g. from 110° to 135° C. which often creates problems in the subsequent processing of the impregnated web. In addition, the dicyandiamide curing agent tends to crystallize in the varnish composition and also on the prepreg made therefrom.

An alternative varnish composition for application to a reinforcing web used in the production of electrical laminates, comprises a blend of a diglycidyl ether of bisphenol A and either bisphenol A or tetrabromobisphenol A and a dicyandiamide curing agent. The diglycidyl ether of bisphenol A is reacted in situ with bisphenol A and/or tetrabromobisphenol A and dicyandiamide during impregnation of the reinforcing web and the partial curing of the resin (see e.g. U.S. Pat. No. 3,738,862). Unfortunately, that varnish system does not exhibit higher glass transition temperatures than the varnish composition described previously. For these and other reasons, it is not widely employed commercially.

It is, therefore, highly desirable to provide an epoxy resin composition for the preparation of electrical laminates, which does not possess the afore-described deficiencies.

That problem is solved by the invention as defined in the claims.

Accordingly, in one form of embodiment the invention provides an epoxy resin composition comprising an epoxy resin, a hardener, an organic solvent and, optionally, an accelerator and other standard adjuncts and being characterized in that the hardener is the reaction product of one hexa-alkyl ether of a hexamethylol melamine having the general formula:

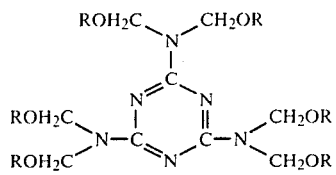

wherein each R is individually an alkyl radical having from 1 to 4 carbon atoms with one polyhydric phenol and, optionally, one monohydric phenol, with the phenolic compound(s) and the hexa-alkyl ether of the hexamethylol melamine being reacted in an amount sufficient to provide at leat one reactive phenolic hydroxyl group for each alkoxy group.

When cured, the epoxy resin compositions of the present invention exhibit excellent properties. In particular, the cured resins exhibit substantially higher glass transition temperatures, e.g. up to and exceeding 160° C., than epoxy resins cured with dicyandiamide. In addition, the hardener component of the resin composition of the invention is soluble in most organic solvents generally used in preparing electrical laminates so that the problem of crystallization of the hardener as experienced with dicyandiamide, is effectively eliminated. Due to these and other properties, the resin compositions of the invention are particularly suitable as the varnish used in the preparation of electrical laminates.

In another form of embodiment, the invention is, therefore, directed to a process for preparing electrical laminates. The process comprises the following steps:

(a) Impregnating a reinforcing web with an epoxy resin varnish comprising an epoxy resin, a hardener for the epoxy resin and an organic liquid;

(b) heating the so prepared prepreg to a temperature sufficient to partially react the epoxy component of the varnish with the hardener component; and (c) fabricating the prepreg into an electrical laminate by laminating one or several layers of the prepreg with an electrically conductive material and heating the so formed laminate at an elevated pressure to elevated temperatures, with the epoxy resin varnish being an epoxy resin composition of the invention.

Due to the high glass transition temperature of the cured epoxy resin composition according to the invention, reinforced electrical laminates prepared by the process of the present invention exhibit an improved distortion property in heat achieved without excessive brittleness.

In addition, the reinforced electrical laminates show improved resistance to attack by various chemicals, lower expansion coefficients and improved electrical properties. Moreover, it has, surprisingly, been found that holes drilled in single-clad 1.5 mm laminate boards, during the preparation of the electrical circuit boards, exhibit an improved quality when inspected using photomicroscopy. Moreover, the drills used to drill these holes exhibited reduced wear when compared to drills used to drill holes in identical laminates; however, such laminates were prepared from conventional resin compositions.

In the practice of the present invention, the epoxy resin component of the resin composition, suitably, are compounds possessing more than one 1,2 epoxide group. In general, the epoxy resin component is a saturated or unsaturated aliphatic, cycloaliphatic, aromatic or heterocyclic compound. It can be substituted with one or more non-interfering substituents such as halogen atoms, phosphorous atoms, hydroxyl groups and ether radicals. The epoxy resin component can be monomeric or polymeric.

Such epoxy resins are well known in the art and are described, e.g. in "The Handbook of Epoxy Resins" by H. Lee and K. Neville (1967), published by McGraw-Hill, New York, in appendix 4-1, pp. 4-35 to 4-56, and U.S. Pat. Nos. 2,633,458; 3,477,990 (particularly col. 2, line 39 to col. 4, line 75); 3,821,243; 3,907,719; 3,975,397 and 4,071,477.

Epoxy resins particularly suitable in the practice of the invention include the glycidyl ethers of 2,2-bis(4-hydroxyphenyl)propane (generally referred to as bisphenol A) and 2,2-bis(3,5-dibromo-4-hydroxyphenyl)-propane (generally referred to as tetrabromobisphenol A); the glycidyl ethers of novolac resins, i.e. phenol aldehyde condensates of the formula:

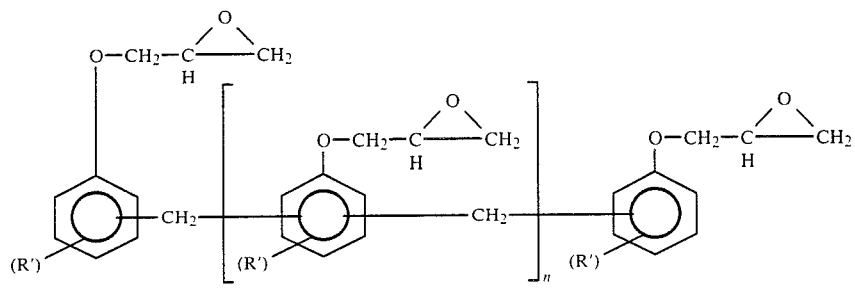

wherein R' is a hydrogen atom or an alkyl radical and n is an integer from 1 to 10; and the glycidyl ethers of tris(phenol), i.e.

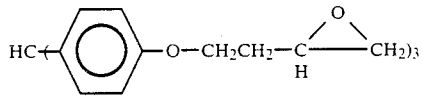

such as described in U.S. Pat. No. 4,394,496. In addition, mixtures of one or several epoxy resins are also usable in this invention. Most preferred are liquid glycidyl polyethers of bisphenol A, the gylcidyl polyethers of tetrabromobisphenol A and mixtures thereof.

The organic liquids suitably employed for the resin compositions of the invention are those organic liquids in which the epoxy resins and the hardener are soluble and which are sufficiently volatile such that they escape from the epoxy resin composition before and/or during the partial cure and/or before the final cure. illustrative examples of such organic liquids include various glycol ethers such as ethylene or propylene glycol monomethylether and the esters thereof such as ethylene glycol monoethylether acetate; ketones such as methylisobutylic ketone, methylethyl ketone, acetone and methylisopropyl ketone; and aromatic hydrocarbons such as toluene and xylene or mixtures thereof. Most preferred are ketones, particularly acetone and methylisobutyl ketone or mixtures thereof with esters, particulaly with ethylene glycol monoethylether acetate.

The amount of solvent contained in the epoxy resin composition will vary depending on a variety of factors including the particularly employed components such as epoxy resin, hardener and solvent and the desired properties of the epoxy resin composition, e.g. the viscosity and the pick-up thereof by the reinforcing web.

Preferably, the epoxy resin composition should have a viscosity of between 50 and 1000 milliPascal seconds (mPas.s) measured using a Brookfield viscometer, RVT type, 20 rpm and an appropriate spindle at 25° C. In general, the amount of solvent will range from 20 to 80 percent by weight, based on the total weight of the epoxy resin composition. Preferably, the epoxy resin composition will contain from 20 to 60 percent by weight of solvent and from 80 to 40 percent by weight of non-volatiles.

The hardener employed in the practice of the invention is the reaction product of the reaction of a hexaalkyl ether of hexamethylol melamine with a polyhydric phenol. The hardeners advantageously employed in the practice of the invention are polyhdric phenolic compounds containing from 2 to 6 phenolic hydroxy groups and from 6 to 30 carbon atoms. Preferably, the polyhydric phenols employed in the practice of the invention have the formula

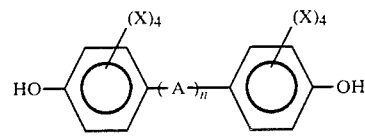

wherein A is oxygen, sulphur, —S—S—, —CO—, —SO—, —SO$_2$—, a divalent hydrocarbon radical containing from 1 to 10 carbon atoms, an oxygen, sulphur or nitrogen containing hydrocarbon radical or a covalent bond; each X is independently hydrogen, halogen or a hydrocarbon radical having from 1 to 10 carbon atoms, preferably from 1 to 4 carbon atoms, and n has a value of 0 or 1. More preferably, A is a divalent hydrocarbon radical having from 1 to 8 carbon atoms and each X is hydrogen. Mixtures of two or more polyhydric phenols can also be employed.

In the practice of the invention, a mixture of one or more polyhydric phenols with one or more monohydric phenols, e.g. with p-tertiary butyl phenol or nonyl phenol, can also be employed in the preparation of the hardener. When a mixture of polyhydric and monohydric phenols is employed that mixture, advantageously, should contain a minor amount of the monohydric phenol. Preferred are such mixtures containing less than 25, more preferably less than 15 percent by weight of the monohydric phenol, based on the total weight of the monohydric and polyhydric phenols.

Most preferably in the practice of the invention, the phenol is a dihydric phenol, particularly 2,2-bis(4-hydroxyphenyl)propane, commonly referred to as bisphenol A (BPA).

The hexa-alkyl ethers of hexamethylol melamine as employed in the practice of this invention, often referred to as amino triazines, have the general formula

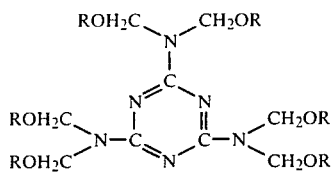

wherein each R, independently, is an alkyl radical having from 1 to 4 carbon atoms. Illustrative examples of such hexa-alkyl ethers of hexamethylol melamines include hexamethoxy methyl melamine, hexaethoxy methyl melamine, hexapropoxy methyl melamine, hexaisoproxy methyl melamine, hexa-1-butoxy methyl melamine, and hexaisobutoxy methyl melamine. Mixtures of two or more hexa-alkyl ethers of hexamethylol melamine can also be employed herein. Hexamethoxy methyl melamine is most preferred.

The hardener is prepared by reacting the phenol with the hexa-alkyl ether of hexamethylol melamine, using amounts of the reactants to provide at least one, preferably from 1.1 to 2.8 phenolic hydroxyl groups for each alkoxy group. The ratio of phenolic hydroxyl groups to alkoxy groups will affect the properties of the epoxy resin composition and the laminates prepared therefrom. For example, laminates exhibit a superior resistance to heat, i.e. a higher glass transition temperature, and other enhanced properties when prepared from epoxy resin compositions having lower ratios of phenolic hydroxyl groups to alkoxy groups. Generally, using a ratio of less than two phenolic hydroxyl groups for each alkoxy group will be suitable to achieve the superior resistance to heat generally desired. Preferably, a ratio of phenolic hydroxy groups to alkoxy groups is from 1.2:1 to 1.95:1, most preferably from 1.4:1 to 1.9:1.

In the preparation of the hardener, the reaction of the phenol with hexa-alkyl ether of hexamethylol melamine can be conducted in the absence of a volatile organic diluent if the hardener is prepared at a high ratio of phenolic hydroxyl groups to alkoxy groups, i.e. more than 2,2 phenolic hydroxyl groups per alkoxy group. In such case, a catalyst is not normally required in the reaction mixture. Generally, the neat reaction is carried out at temperatures from 120° to 200° C., with completion of the reaction being evidenced by ceasing of the development of monohydric alcohol corresponding to the alkoxy group.

When the hardener is prepared at the preferred low ratios of phenolic hydroxyl groups to alkoxy groups, i.e. from 1 to 2 phenolic hydroxyl groups per alkoxy groups, in the absence of a diluent and at the reaction conditions as described in U.S. Pat. No. 4,393,181, a gelled material will arise which is not soluble in the common organic solvents prior to the desired conversion of the hexamethylol melamine.

To obtain a reaction product which, to a satisfactory degree, is soluble in organic solvents, a preferred method is employed which comprises reacting of the phenol with the hexa-alkyl ether of hexamethylol melamine in the presence of a catalyst using an organic liquid diluent. The described method is advantageously employed in preparing the hardener at any desired ratio of phenolic hydroxylic groups to alkoxy groups, but it is particularly useful in preparing the hardener at the preferred low ratios of phenolic hydroxyl groups to alkoxy groups. The reaction is advantageously carried out at an elevated temperature, preferably from 80° to 250° C., more preferably from 100° to 200° C.

It is generally desirable to advance the reaction between the phenolic compounds and the hexa-alkyl ether of the hexamethylol melamine to completion which is evidenced in that monohydric alcohol corresponding to the alkoxide group ceases to develop thereby achieving the maximum glass transition temperature of the cured resin prepared from the corresponding epoxy resin composition. In addititon, the non-reacted alkoxy groups are capable of reacting at the conditions of cure of the epox resin which, by releasing the monohydric alcohol, is likely to cause vaporization of a liquid (i.e. the monohydric alcohol). Mayor amounts of unreacted alkoxy groups can, therefore, cause processing problems in the preparation of the laminates owing to the vaporization of the liquid.

The organic liquid diluent preferably employed for the reaction is an organic liquid in which the phenol and the hexamethylol melamine starting material and their reaction product are soluble. Preferably, the organic liquid reaction diluent is inert to the reaction and boils at a temperature above the boiling point of the monohydric alcohol formed during the reaction of the phenol and the alkyl ether of hexamethylol melamine. In addition, the organic volatile reaction diluent, advantageously, can be employed as the solvent for the epoxy resin composition to be prepared using the reaction product as a hardener. Examples of organic liquids suitably used as reaction diluents, generally are those organic liquids useful as the solvent for the epoxy resin component of the composition. The esters, particularly ethylene glycol monoethylether acetate and the ketones, particularly lower ketones such as methylisobutyl ketone, are preferred.

The organic liquid reaction diluent, preferably, is employed in an amount from 5 to 80 percent by weight, based on the total weight of the reaction mixture, including both volatile and non-volatile diluents. Preferably, the reaction mixture will contain from 10 to 60 weight percent of the oganic liquid reaction diluent.

The catalyst which is used in the reaction of the phenol with the hexa-alkyl ether of the hexamethylol melamine, is a Lewis acid, with such term including all protonic (Bronsted) acids. Such acids include, for example, mono- or dicarboxylic acids such as para-toluene sulphonic acid and mineral acid such as sulphuric acid or hydrochloric acid. The acid catalyst is employed in an amount sufficient to catalyze the reaction. Although such amounts can vary depending on a variety of factors including the specific starting materials and the specific acid catalyst employed and the specific reaction conditions, in general, the catalyst will be employed in an amount from 0.01 to 0.2, preferably from 0.05 to 0.5 percent by weight, based on the total weight of the phenol and of the hexa-alkyl ether of the hexamethylol melamine.

Upon completion of the reaction of the hexa-alkyl ether of the hexamethylol melamine and of the phenol, the reaction product can subsequently be recovered from the organic liquid diluent by evaporation of the diluent. As the organic liquid diluent, generally, is employed as the solvent or as a component of the solvent for the epoxy resin composition of this invention, separation thereof is not generally necessary.

The amount of the hardener employed in the epoxy resin varnish composition of the invention is dependent on a variety of factors including the specific hardener and the specific resin employed and the properties of the composition and its specific end-use applications. In general, the proportion of hardener in the epoxy resin composition is selected to provide a cured epoxy resin composition exhibiting a maximum glass transition temperature. Generally, such amounts will vary such that the ratio of phenolic hydroxyl groups in the hardener to epoxy groups of the epoxy resin component in the varnish composition is from 0.5:1 to 2:1. Preferably, the hardener is employed in amounts such that the epoxy resin composition comprises from 0.8 to 1.2 phenolic hydroxyl groups per epoxy group.

The epoxy resin composition of the invention, optionally, can contain an accelerator for the reaction between the hardener and epoxy resin. Typical examples of various materials catalzying this reaction are the stanneous salts of monocarboxylic acids, such as stannous octoate and stannous heterocyclic compounds such as imidazole and benzimidazole compounds and salts thereof, tertiary amine borates and tertiary amines. The heterocyclic compounds useful herein, generally, are those containing in the heterocyclic ring a substituted C=N—C group and a secondary amino group, i.e. an =N—H group. These heterocyclic compounds include imidazoles, such as the substituted imidazoles and the substituted benzimidazoles of the general structural formula:

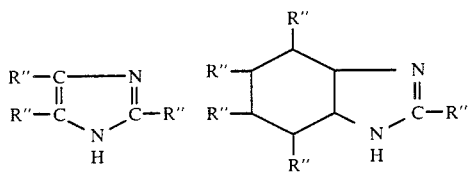

wherein each R'', independently, is a hydrogen, a halogen or an organic radical such as a hydrocarbon radical or a substituted hydrocarbon radical. Examples of substituted hydrocarbon radicals include the esters, ethers, amides, imides, amines, halogens and and mercapto-substituted hydrocarbon radicals. Preferably, each R'' is a hydrogen or a hydrocarbon radical having from 1 to 4 carbon atoms.

Preferrred accelerators are the imidazoles, particularly the alkyl-substituted imidazoles, such as 2-methyl imidazole and the tertiary amines, such as benzyl dimethyl amine. Most preferably, the accelerator is benzyl dimethyl amine or 2-methyl imidazole.

The accelerator, in general, is used in an amount sufficient to catalyze the reaction. Although such an amount will vary, depending on the particular starting materials as used, such as accelerator, epoxy resin and hardener, the accelerators are generally used in amounts from 0.01 to 5 percent by weight, based on the total weight of the epoxy resin and the hardener. Preferably, the accelerator is employed in an amount from 0.02 to 3 percent by weight, based on the total weight of the epoxy resin and the hardener.

The varnish composition of the present invention, preferably, comprises from 5 to 50, most preferably from 15 to 40 percent by weight of epoxy resin; from 5 to 40, preferably from 15 to 35 percent by weight of hardener; from 25 to 55 percent by weight of organic solvent and from 0.02 to 2 percent by weight of accelerator, with the afore-going weight percents being based on the total weight of the composition.

In the practice of the invention also other substances can be added or admixed to the epoxy resin composition of the invention. Such substances are common adjuncts, such as dyes or pigments, thixotropes, fluidity controlling agents and stabilizers.

The epoxy resin compositions of the present invention are particularly useful in impregnating, for example, weaves, webs, fabrics, and cloths from a variety of different materials including glass, quartz, carbon, aramid and boron fibers especially for preparing electrical laminates. In the preparation of electrical laminates, in general, a glass fiber and an epoxy resin composition of the invention are employed.

In the process of the present invention for preparing electrical laminates, the epoxy resin is applied to the reinforcing web in the desired amount and, subsequently, the web is heated to achieve pre-curing of the epoxy resin. Although the amounts of the epoxy resin applied to the reinforcing web can considerably vary depending on the specific reinforcing web and the specific epoxy resin composition, the desired properties of the impregnated material and the electrical laminates prepared therefrom, the epoxy resin composition of the present invention is generally combined, in conventional quantity ratios, with the reinforcing web, with 30 to 70 percent by weight of the epoxy resin composition, based on the total weight of the impregnated web, being employed.

The impregnated web or prepreg is subsequently processed using conventional techniques. Such techniques envolve pre-curing and partial curing, respectively, of the epoxy resin by heating the impregnated web to an elevated temperature, such as from 100° to 200° C. Subsequently, the prepreg is laminated in that one or several prepregs are bonded by lamination, subsequently cut to a predetermined size and combined with thin layers of an electrically conducting material such as copper foil, using elevated temperatures and pressures. Conventionally, the laminating temperatures vary from 130° to 230° C., with pressures varying from 34 kPa to 6.9 MPa.

In the following examples, the epoxy resins are designated as follows:

"Epoxy Resin A" is an epoxidized phenol/formaldehyde novolac resin having an epoxy equivalent weight (EEW) between 160 and 190 and a functionality of 5.6.

"Epoxy Resin B" is the diglycidyl ether of tetrabromobisphenol A having an EEW between 430 and 470.

"Epoxy Resin C" is the diglycidyl ether of bisphenol A having an EEW beween 177 and 188 and a viscosity at 25° C. between 7 and 10 Pa.s.

"Epoxy Resin D" is a diglycidyl ether of bisphenol A having an EEW between 182 and 192 which has been raised with tetrabromobisphenol A to an EEW of between 400 and 475. Epoxy Resin D is used as an 80 percent by weight solution of the epoxy resin in acetone.

In the following examples, all parts and percentages set forth herein are by weight unless otherwise expressly indicated.

EXAMPLE 1

A. Preparation of Hardener A

A jacketed stainless steel reactor equipped with an agitator, condensing and heating means and a condensor was charged with 25 parts of hexamethoxymethyl melamine (Cymel ® 303 available from American Cyanamid), 25 parts of ethylene glycol monoethylether acetate and 75 parts of bisphenol A. This reaction mixture contains 1.71 phenolic OH-groups for each alkoxy group. The mixture was heated under a nitrogen blanket to 80° C. When the mixture had obtained this temperature, 0.09 parts of oxalic acid dihydrate were added as a catalyst. The temperature of the resulting reaction mixture was increased to between 110° and 15° C. at which time measurable amounts of methanol began to be distilled off. The reaction mixture was now slowly heated for an additional two hours to between 142° and 145° C. with methanol continued to be distilled off. The reaction mixture was then maintained at this temperature for an additional one hour. At the end of this time, methanol ceased to evolve from the reaction mixture. The reaction mixture was cooled to room temperature and then diluted with 65.5 parts of methylisobutyl ketone to give a solution containing 50 percent by weight of solids.

Based on the total solids of the resulting solution, the phenolic hydroxyl content was 8.1 percent by weight or 0.48 phenolic hydroxyl equivalents per 100 grams of solid material.

B. Preparation of the Epoxy Resin Varnish Composition

An epoxy resin solution was prepared by mixing 41.5 parts of the previously prepared hardener (i.e. 83 parts of the 50 percent hardener solution) with 21.9 parts of Epoxy Resin C, 36.7 parts of Epoxy Resin B, 14.7 parts of toluene and 0.094 parts of 2-methylimidazole. The solids content of the composition was 63%. This varnish composition had a Brookfield viscosity of 0.15 Pa.s and a plate gel time of 380 seconds at 150° C. and of 171 seconds at 170° C. The plate gel time is a measurement of how fast the epoxy resin of the varnish composition will cure to a gelled rubbery mass. It was determined using a thermoelectric cure plate having a temperature controller with a temperature variation of ±1° C. Approximately 0.3 to 0.4 ml of the varnish composition were placed in the plate center after the plate had stabilized at the desired temperature. A stop watch was started as the composition initially touched the plate. The molten resin was worked from one side to the other side of the plate using a spatula. Every 5 seconds the spatula was pulled rapidly away from the varnish composition, pulling strings of polymer with it. The gel time was recorded as the time at which the strings could no longer be pulled away from the polymer mass.

C. Preparation of Electrical Laminates

The resulting varnish composition was used for impregnating a glass cloth (Marglas 7628 finish 782). This cloth is an industrial glass silk fabric of equal warp and weft (plain weave) of electrical grade glass treated with finish 782. The glass silk fabric was impregnated with the varnish on a vertical-type treater such that 320 grams (±10 grams) of the resin composition were applied for each square meter of fabric. The impregnated fabric was then treated at a temperature of between 125° and 150° C. to advance curing of the epoxy resin. The precured prepregs were then fabricated into "FR-4"-type electrical laminates to contain 1 ply of copper foil and 9 plies of prepreg. The epoxy resins of the laminates were cured by heating the laminates to 130° C. for 20 minutes, maintaining the temperature at 130° C. for 60 minutes, heating the laminates to between 170 and 180 minutes for 15 minutes, maintaining the laminates at this temperature for between 120 and 180 minutes and subsequently cooling with water for 20 minutes or with air and water for 50 minutes. The pressure during this curing stage was 50 kg/cm$^2$, applied using a Netstal 300 ton press.

The glass transition temperature of the cured epoxy resin prepared from the varnish composition and the Z Axis Expansion Coefficient, the Dielectric Loss Factor and the Copper Peal Strength were measured on the resulting electrical laminate. In addition, the laminate was subjected to a pressure cooker test. The results of all such testing are recorded in Table I.

EXAMPLE 2

An epoxy resin varnish composition was prepared by mixing 21.8 parts of Epoxy Resin A, 36.7 parts of Epoxy Resin B, 41.5 parts of Hardener A (i.e. 83 parts of a 50% solution of Hardener A), 0.032 parts of 2-methylimidazole and 21.3 parts of toluene. The solids content of the resulting composition was 61.3%. This varnish composition had a Brookfield viscosity of 0.19 Pa.s measured using a Brookfield viscometer, RVT model, and 250 rpm at 25° C. and the appropriate spindle. The curing time of the varnish composition defined by plate gelling, was 189 seconds at 170° C. The glass transition temperature of the cured epoxy resin was measured and is recorded in Table I.

Laminates were prepared using techniques identical to those employed in Example 1. The physical properties of the laminates were measured and recorded in Table I.

COMPARATIVE TEST A

A varnish composition was prepared according to the prior art by mixing 125 parts by weight of Epoxy Resin D, 3 parts by weight of dicyandiamide and 0.42 parts by weight of N,N'-dimethyl benzyl amine and appropriate amounts of solvent. The glass transition temperature of the epoxy resin prepared from this composition was measured and is recorded in Table I.

Laminates were prepared using similar techniques to those employed in Examples 1 and 2. The physical properties of these laminates were measured and equally recorded in Table I.

TABLE I

| | Example 1 | Example 2 | Comparative Test A |
|---|---|---|---|
| Glass Transition Temperature (Tg) °C. | 150–155° | 170–175° | 118° |
| Z Axis Expansion Coefficient (1) ×10$^{-5}$/K | | | |
| before Tg | 7 | 5 | 8 |
| after Tg | 21 | 23 | 30 |
| Pressure Cooker Test, hrs. (2) | 2 | 3 | 1 |
| Dielectric Loss Factor (3) | | | |
| 75° C. | 0.0020 | 0.0024 | 0.0060 |
| 100° C. | 0.0027 | 0.0031 | 0.0102 |
| 125° C. | 0.0045 | 0.0038 | 0.0515 |

TABLE I-continued

|  | Example 1 | Example 2 | Comparative Test A |
|---|---|---|---|
| 150° C. | 0.0178 | 0.0121 | 0.0790 |
| Copper Peal Strength (4) kPa/2.5 cm | 3.2 | 3.5 | 3.7 |

(1) Z Axis expansion coefficient is a measure of the expansion in the thickness of the sample with increasing temperature as determined by thermal mechanical analysis.
(2) Pressure Cooker Test is a measure of the temperature resistance of the sample as determined by cooking of the sample in the atmosphere above water boiling at 2 bars, 121° C. and subsequently immersing the sample in a solder bath at 260° C. for 20 seconds and inspecting this sample for blistering. The time indicated represents the number of hours the sample can be cooked without blistering upon subsequent immersion in the solder bath.
(3) Dielectric Loss Factor was measured using a Schering Bridge, 500 Volts, 50 hertz, a ring electrode with 20 cm$^2$ area which indicates the electrical insulation properties of the laminate.
(4) The Copper Peal Strength was measured by an Instrom IM tester, using a 1 inch sample width. It indicates the adhesion of the copper to the laminate (yates copper foil (1 oz). treatment TW).

As conveyed by Table I, the glass transition temperature of the cured epoxy resin prepared from the epoxy resin composition of the present invention is substantially higher than that of the cured resin prepared from prior art varnish compositions. In addition, the Z Axis expansion coefficient was desirably lower from the laminates preapred from the varnish composition of the invention as were the dielectric loss factors.

The drillability of the laminates was measured by sandwiching three electrical laminate boards between a phenolic paper top board and a wooden bottom plate. The sandwich was drilled with a Sphinx quality drill typical for such drilled holes having a diameter of 0.95 mm. The drill was operated at a speed of 48 500 rpm with 2400 holes (8000 holes per laminate board) being drilled at a rate of 140 holes per minute. Photomicrographs were taken of the holes in the rigid holes and the drills were inspected for wear. The drill used for the holes in the sandwiches prepared from the laminates in Example 1 showed very low wear when compared to the drill used in drilling the laminates of Comparative Test A. The wear on the drill used for the sandwich prepared from the laminates of Example 2 was between that of Example 1 and that of Comparative Test A.

EXAMPLE 3

A. Preparation of Hardener B

A hardener solution (Hardener B) was prepared by mixing 15 parts of hexamethoxymethyl melamine, 45 parts of bisphenol A and 15 parts of ethylen glycol monomethylether acetate at room temperature and heating the resultant mixture under a nitrogen blanket to 90° C. To the resultant mixture were added 0.09 parts of oxalic acid dihydrate, and the resultant reaction mixture, subsequently, was heated to 140° C. over a three hour period. The reaction mixture was maintained at 140° C. for an additional hour at which time methanol ceased being evolved from the reaction mixture. The reaction mixture was then diluted with 28.7 parts of methylisobutylic ketone to give a solution containing 55.26 percent by weight of solids. The hardener solution was then cooled to room temperature. The kinematic viscosity of the resulting solution at 25° C. was 2190 centistokes (0.00219 m$^2$/s). Based on the total solids of the resultant solution, the phenolic hydroxyl content was 7.73 percent by weight or 0.45 phenolic hydroxyl equivalents per 100 grams of solid material.

B. Preparation of the Epoxy Resin Solution

An epoxy resin solution was prepared by mixing 28 parts of an Epoxy Resin A, 47 parts of Epoxy Resin B and 25 parts of methylisobutylic ketone. The solution had a kinematic viscosity of 550 centistokes, an epoxide content of 14.43, based on the total weight of the solids in the solution, and an EEW of 298, based on the solids content.

C. Preparation of an Epoxy Resin Composition

An epoxy resin composition was prepared by mixing 132 parts of the epoxy resin solution, 133 parts of the Hardener B solution, 1 part of a 5% solution of 2-methyl imidazole in methanol and 48.9 parts of methylisobutyl ketone.

The varnish composition contained 55.2 percent solids and exhibited a plate gel time of 650 seconds at 150° C., and 195 seconds at 175° C. The epoxy resin was cured at 190° C. for 90 minutes. The cured resin exhibited a glass transition temperature of 170°–175° C., as measured using differential thermal analysis.

EXAMPLES 4–7

Following the general procedure of Example 1, a series of hardeners (Hardeners C, D, E' and F) were prepared using the specific conditions with respect to the concentration of the diluent, the phenol and the hexamethylol melamine as set forth in Table II.

TABLE II

| TYPE OF HARDENER | C (5) | D | E | F |
|---|---|---|---|---|
| Starting Materials, Parts |  |  |  |  |
| HMMM (1) | 25 | 27 | 30 | 35 |
| Bisphenol A | 75 | 73 | 60 | 65 |
| p-tertiary butyl phenol | — | — | 10 | — |
| Phenolic OH/Alkoxy OH | 1.71 | 1.54 | 1.28 | 1.06 |
| SOLVENT, Parts |  |  |  |  |
| Ethylene Glycol Monoethyl Ether Acetate | 25 | 25 | 25 | 33.6 |
| Reaction Conditions (2) |  |  |  |  |
| Time, hours | 4.5 | 5.0 | 5.5 | 2 |
| Final Reaction Temperature, °C. | 150 | 145 | 150 | 120 |
| Yield, % (3) | 92 | 92 | 80 | 63 |
| Phenolic OH, % (4) | 8.19 | 7.91 | 6.92 | 6.28 |

(1) HMMM = hexamethoxymethyl melamine
(2) The reaction conditions include Time which is the total reaction time including the heating of the reaction mixture followed by the initial evolution of methanol and the Final Reaction Temperature. The Final Reaction Temperature in its turn is the highest temperature to which the mixture is heated.
(3) Yield is the percent of alkoxy groups of the HMMM which were reacted as determined by the amount of methanol distillate.
(4) Phenolic OH is the phenelic hydroxy content expressed as a weight percent of the solids in the final product.
(5) When reacted according to the method of U.S. Pat. No. 4,393,181, a blend of 75 parts of bisphenol A and 25 parts of HMMM was found to form an irreversible gel which is not soluble in organic liquids. Therefore, the product could not be employed inpreparing a corresponding epoxy resin composition. Using the techniques of U.S. Pat. No. 4,393,181, a non-gelled product is obtainable only when the reaction mixture contains more than 2.2 phenolic OH groups for each alkoxy group.

Epoxy resin compositions (Samples Nos. 4–7) were prepared from each of the hardener solutions, the Epoxy Resins B and C and 2-methylimidazole at the concentrations specified in Table III. Acetone was used as an additional solvent. The amounts of acetone were selected to form a 60% solution. The gel time and the glass transition temperature of each of the compositions were determined; the corresponding results are set forth in Table III.

COMPARATIVE TEST B

A hexamethoxymethyl melamine/bisphenol A reaction product was prepared according to the method of U.S. Pat. No. 4,393,181 by blending 16 parts HMMM and 84 parts of bisphenol A (no solvent and no catalyst being employed). The mixture contained 3 phenolic hydroxy groups per each methoxy group. This mixture was slowly heated to 165° C. over a 2-hour period and was maintained at this temperature for an additional 2-hour period until the evolution of methanol substantially ceased. The percentage yield was found to be 94%, and the product (Hardener G) when cooled to room temperature, was a light-coloured friable solid. The product contained 9.84% phenolic OH groups, based on the total weight of the hardener. An epoxy resin composition was then prepared with this hardener, using the epoxy resins and 2-methylimidazole in the amounts specified in Table III. Acetone was used as an additional solvent in an amount sufficient to prepare a 60 weight percent solution.

TABLE III

| Example No. | 4 | 5 | 6 | 7 | Comparative Test B |
|---|---|---|---|---|---|
| Epoxy Resin Composition (1) Formulation, Parts | | | | | |
| Hardener C | 39.5 | — | — | — | — |
| Hardener D | — | 40.2 | — | — | — |
| Hardener E | — | — | 43.0 | — | — |
| Hardener F | — | — | — | 44.5 | — |
| Hardener G | — | — | — | — | 36.5 |
| Epoxy Resin B | 37.5 | 37.5 | 37.5 | 37.5 | 37.5 |
| Epoxy Resin C | 23 | 22.3 | 19.5 | 18 | 26 |
| 2-methylimidazole | 0.1 | 0.1 | 0.1 | 0.1 | 0.1 |
| Gel Time 175° C. seconds (2) | 128 | 103 | 121 | 149 | 210 |
| Glass Transition Temperature, °C. (3) | 153 | 157 | 149 | 153 | 135 |

(1) The resin formulations were prepared at a ratio of epoxy resin to hardener to provide equivalent amounts of phenolic OH-groups and epoxy groups. The indications on parts of each component are based on solids. The hardener is employed in an amount such that the composition contains equivalent amounts of phenolic OH-groups and epoxy groups.
(2) Gel time is a measure of the reactivity of the epoxy resin. It was determined using the method as described in Example 1.
(3) Glass transition temperature of a cured film of the epoxy resin composition measured using differential thermal analysis.

From Examples 4–7 and Comparative Test B and the data recorded in Table III it is clearly seen that the reactivity of the epoxy resin and the properties of the cured epoxy resin prepared from the epoxy resin compositions of the invention are dependent on the ratio of phenolic OH to alkoxy groups in preparing the hardener. In particular, the glass transition temperature of the cured epoxy resins at the preferred low ratio of phenolic OH to alkoxy groups (i.e. from 1 to less than 2 phenolic OH groups per alkoxy group) is significantly higher than that of epoxy resins cured using a hardener prepared at higher ratios of phenolic OH groups to alkoxy groups.

EXAMPLE 8

A varnish composition was prepared by mixing 48 parts of the 50% Hardener B solution, 45 parts of Epoxy Resin C, 31 parts of tetrabromobisphenol A, 9.4 parts of ethylene glycol monomethylether and 0.1 part of 2-methylimidazole.

The resultant varnish composition was comprised of 75% solids, the Brookfield viscosity was 180 mPa.s at 25° C. and the plate gel time was 210 seconds at 170° C. The cured epoxy resin exhibited a glass transition temperature of 135° C.

Prepregs were made from this epoxy resin composition by hand impregnation of a glass cloth and by drying in an oven at 180° C. during 120 seconds. Eight plies were pressed together to form a laminate, at a maximum pressure of 40 kg/cm² and a maximum temperature of 180° C. The temperature and the pressure were maintained for one hour.

COMPARATIVE TEST C

A varnish composition was prepared by mixing 31 parts of tetrabromobisphenol A, 69 parts of Epoxy Resin C, 3.5 parts of dicyandiamide, 0.2 parts of N,N'-dimethylbenzyl amine (as an accelerator) and a sufficient amount of ethylene glycol monomethylether. This 60% composition was cured and the cured epoxy resin exhibited a glass transition temperature of only 118° C. Also laminates were prepared from the varnish composition of this comparative test using the method of Example 8. Due to the poorer high temperature properties of the epoxy resin cured using dicyandiamide, these laminates did not exhibit the excellent heat distortion properties exhibited by those prepared in Example 8.

We claim:
1. An epoxy resin composition comprising an epoxy resin, a hardener, an organic solvent and, optionally, an accelerator and other standard adjuncts, characterized in that the hardener is the reaction product of a hexaalkyl ether of a hexamethylol melamine having the general formula:

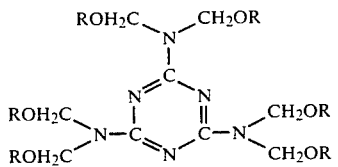

wherein each R is individually an alkyl radical having from 1 to 4 carbon atoms with a polyhydric phenol and, optionally, a monohydric phenol, in the presence of an acidic catalyst and an organic solvent wherein the ratio of phenolic hydroxyl groups to alkoxy groups is less than two phenolic hydroxyl groups for each alkoxy group.

2. The epoxy resin composition of claim 1, characterized in that the epoxy resin is a glycidyl polyether of 2,2-bis(4-hydroxyphenyl)propane, 2,2-bis(3,5-dibromo-4-hydroxyphenyl)propane or a mixture thereof, a glycidyl ether of a novolac resin or the glycidyl ether of tris(phenol).

3. The epoxy resin composition of claims 1 or 2, characterized in that the phenol and the hexamethylol melamine alkyl ether used in preparing the hardener have been employed in an amount to provide less than two reactive phenolic hydroxyl groups for each alkoxy group.

4. The epoxy resin composition of claim 3, characterized in that, in the preparation of the hardener, the ratio of phenolic hydroxyl groups to alkoxy groups is from 1.2 to 1.95 and that the composition comprises from 0.5 to 2 phenolic hydroxy groups of the hardener per each epoxy group of the epoxy resin.

5. The epoxy resin composition of claims 1, 2, 3 or 4, characterized in that the phenol used in preparing the hardener is a dihydric phenol of the general structural formula

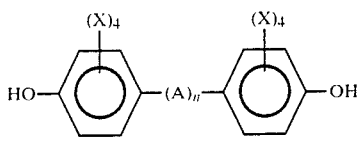

wherein A is oxygen, sulphur, —S—S—, —CO—, —SO$_2$—, a divalent hydrocarbon radical containing from 1 to 10 carbon atoms, an oxygen, sulphur or nitrogen containing divalent hydrocarbon radical or a covalent bond; each X is independently hydrogen, halogen or a hydrocarbon group having from 1 to 10 carbon atoms, preferably from 1 to 4 carbon atoms, and n has a value of 0 to 1 or a mixture thereof.

6. The epoxy resin composition of claim 5, characterized in that A is a divalent hydrocarbon radical having from 1 to 8 carbon atoms and each X is hydrogen.

7. The epoxy resin composition according to claim 6, characterized in that the polyhydric phenol is 2,2-(4-hydroxyphenyl)propane.

8. The epoxy resin composition of claim 5, characterized in that the hexa-alkyl ether of hexamethylol melamine is hexamethoxy methyl melamine, hexaethoxy methyl melamine, hexapropoxy methyl melamine, hexaisopropoxy methyl melamine, hexa-1-butoxy methyl melamine, hexaisobutoxy methyl melamine or a mixture thereof.

9. The expoxy resin composition according to claim 8, characterized in that the polyhydric phenol is 2,2-bis(4-hydroxyphenyl)propane and the hexaalkyl ether of hexamethylol melamine is hexamethoxy methyl melamine.

10. The epoxy resin composition of claim 4, characterized in that the solvent is an ester, glycol ether, ketone, aromatic hydrocarbon or a mixture thereof, and the composition comprises from 20 to 80 percent by weight of the solvent.

11. The epoxy resin composition according to claim 4, characterized in that the solvent is ethylene glycol monoethyl ether acetate, a ketone or a mixture thereof.

12. The epoxy resin composition according to claim 4, characterized in that the composition contains, as an accelerator, from 0.01 to 5 percent by weight, based on the weight of the harder, of a stannous salt of a monocarboxylic acid, an alkali metal salt, an imidazole or benzimidazole compound or salts thereof, a tertiary amine borate or a tertiary amine.

13. The epoxy resin composition according to claim 12, characterized in that the accelerator is an alkyl-substituted imidazole or a tertiary amine.

14. The epoxy resin composition according to claim 1, characterized in that the composition additionally comprises tetrabromobisphenol A.

* * * * *